United States Patent
Pogge et al.

[11] Patent Number: 6,087,199
[45] Date of Patent: Jul. 11, 2000

[54] METHOD FOR FABRICATING A VERY DENSE CHIP PACKAGE

[75] Inventors: H. Bernhard Pogge, Hopewell Junction; Bijan Davari, Mahopac, both of N.Y.; Johann Greschner, Pliezhausen, Germany; Howard L. Kalter, Colchester, Vt.

[73] Assignee: International Business Machines Corporation, Armonk, N.Y.

[21] Appl. No.: 09/018,737

[22] Filed: Feb. 4, 1998

[51] Int. Cl.⁷ .......................... H01L 21/44; H01L 21/48; H01L 21/50
[52] U.S. Cl. ............................................ 438/106; 438/110
[58] Field of Search .................................. 438/110, 106

[56] References Cited

U.S. PATENT DOCUMENTS

| | | |
|---|---|---|
| 4,489,364 | 12/1984 | Chance et al. . |
| 4,542,397 | 9/1985 | Biegelsen et al. . |
| 4,670,770 | 6/1987 | Tai . |
| 4,709,468 | 12/1987 | Wilson . |
| 4,783,695 | 11/1988 | Eichelberger et al. . |
| 4,884,122 | 11/1989 | Eichelberger et al. . |
| 4,933,042 | 6/1990 | Eichelberger et al. . |
| 4,949,148 | 8/1990 | Bartelink . |
| 4,954,875 | 9/1990 | Clements . |
| 4,967,146 | 10/1990 | Morgan et al. . |
| 5,019,535 | 5/1991 | Wojnarowski et al. . |
| 5,023,205 | 6/1991 | Reche . |
| 5,034,091 | 7/1991 | Trask et al. . |
| 5,091,330 | 2/1992 | Cambou et al. . |

(List continued on next page.)

FOREIGN PATENT DOCUMENTS 0 417 345 A1   3/1991   European Pat. Off. .

OTHER PUBLICATIONS

M. Gdula, et al, "A 36-Chip Multiprocessor Multichip Module With The General Electric High Density Interconnect Technology" IEEE, V.91, pp. 727–730, 1991.

H. Linde, et al, "Wet Silicon Etching With Aqueous Amine Gallates" Jrl. Electrochemical Soc., V.139, #4. pp. 1170–1174, Apr. 1992.

Marketing Materials, "High Denisty Multichip Interconnect–Reliability Data" Hughes Microelectronic Circuits Division, A Subsidiary of GM Hughes Electronics, Newport Beach, CA 3 pages, post 1992.

R.J. Wojnarowski, et al. "Three Dimensional Hybrid Wafer Scale Integration Using the GE High Density Interconnect Technology" IEEE Confedrence on Wafer Scale Integration, Ses. 7, WSI Tech. 1–p308–316 1993.

M. Despont, et al. "New Design of Micromachined Capacitive Force Sensor" Jrl. of Micromechanics & Microengineering V 3, #4, pp. 239–242, Dec. 1993.

D. Sandler, et al., "Fabrication of Metallic Microstructures by Electroplating Using Deep–Etched Silicon Molds Molds" IEE, Jrl. of Microelectromechanical Systems, V.4 #2, pp. 81–86, Jun. 1995.

J.P. Krusius, et al., "Tiled Silicon Report", pp. 1–18, shows 040996.

J. Talghader, et al., "Integration of Fluidically Self–Assembled Optoelectronic Devices Using a Silicon–Based Process" IEEE Photonics Technology Letters, 7, No. 11, Nov. 1995.

Primary Examiner—John F. Niebling
Assistant Examiner—Josetta Jones
Attorney, Agent, or Firm—Joseph P. Abate

[57] ABSTRACT

A method for fabricating an integrated circuit package or arrangement includes providing a carrier having a surface topography of projections or recesses for supporting individual semiconductor circuit chips having conversely matching bottom surface topographies to permit self-aligned positioning of the chip on the carrier. Chips are provided such that top faces of neighboring chips lie substantially in planes separated by a distance of greater than 0.0 $\mu$m. The carrier is arranged and dimensioned such that the neighboring chips are separated by a gap G or spacing in a range of 1 $\mu$m<G$\leq$100 $\mu$m. A metallic interconnect is provided over the top faces and the gap. Preferably, the interconnect has a gradual slope over the gap.

23 Claims, 11 Drawing Sheets

U.S. PATENT DOCUMENTS

| | | |
|---|---|---|
| 5,168,344 | 12/1992 | Ehlert et al. . |
| 5,207,866 | 5/1993 | Lue et al. . |
| 5,229,647 | 7/1993 | Gnadinger . |
| 5,331,203 | 7/1994 | Wojnarowski et al. . |
| 5,353,493 | 10/1994 | Fillion et al. . |
| 5,353,498 | 10/1994 | Fillion et al. ............................ 29/840 |
| 5,355,102 | 10/1994 | Kornrumpf et al. . |
| 5,373,627 | 12/1994 | Grebe . |
| 5,432,681 | 7/1995 | Linderman . |
| 5,561,085 | 10/1996 | Gorowitz et al. . |
| 5,770,884 | 6/1998 | Pogge et al. . |
| 5,783,340 | 7/1998 | Farino et al. . |
| 5,814,885 | 9/1998 | Pogge et al. . |
| 5,866,443 | 2/1999 | Pogge et al. . |
| 5,904,495 | 5/1999 | Burke et al. . |

METHOD FOR FABRICATING A VERY DENSE CHIP PACKAGE

BACKGROUND OF THE INVENTION

1. Field of the Invention

This invention relates to an integrated circuit arrangement such as a chip packaging configuration.

2. Description of the Related Art

As advances in semiconductor processing occur, the scale of individual integrated circuit devices continues to shrink, making it possible to incorporate increasing amounts of functionality in a single integrated circuit chip. For example, sixteen 1 MBIT Dynamic Random Access Memory (DRAM) chips of equal size in 1984 required a total chip area of 800 mm$^2$, while a single 16 MBIT design containing the same functionality in 1990 required only 110 mm$^2$. Thus, although the individual chip size has increased by approximately 50%, the net chip density on such chips has increased by a significant factor. Accordingly, as integrated circuit chips are required to incorporate more and more functionality, the sizes of the chips have been steadily increasing.

However, there are practical problems associated with continually increasing the maximum chip size. A first set of problems relates to the physical limits of present day fabrication equipment. For example, state-of-the-art manufacturing lithography equipment commonly used to expose high resolution patterns through masks onto semiconductor substrates effectively limits chip size to the size of the lithography exposure field of the equipment. The size of the direct exposure field of state-of-the-art manufacturing lithography equipment in the mid 1990s is generally on the order of 25 mm in diameter, allowing square chip design exposure of about 324 mm$^2$ (18 mm×18 mm). Most DRAM chip designs in development are rectangular and tend to be 20 mm×10 mm, or larger. While a mask larger than the lithography exposure field of the equipment can be split into multiple smaller masks that are "stitched" together to effectively multiply the size of the lithography exposure field, such "stitching" introduces undesired inaccuracies and occupies valuable space on the semiconductor substrate. A solution to the exposure field/stitching problem is to develop fabrication equipment having a larger exposure field and, therefore, the capability to manufacture larger chips without stitching masks together. However, such a solution would require massive financial investment in research and development.

Additionally, in order for a wafer to produce a large enough number of chips to make the manufacturing of larger chips practical, semiconductor wafers would need to migrate to a larger size, thereby requiring further substantial investment in the development of new crystal pulling equipment, and wafer processing and handling equipment.

Another problem relates to a general trend of wafer yields decreasing with increasing chip size. FIG. 1 summarizes different manufacturing chip yields as a function of a chip edge dimension (square chips). It will be observed that as a chip area increases, the effective chip yields reduce nearly linearly. The different curves relate to different design complexities, with the topmost curve being the least complex and the bottom-most curve being the most complex of the three exemplary curves. The decrease in yield with increasing chip size can be attributed to the fact that, for the same quality of semiconductor, any defect existing in a larger chip results in an overall greater area waste than is the case with smaller chip wafers. As chip size increases, the cost of manufacturing because of yield degradation becomes prohibitive.

Conventional multi-chip modules (MCMS) avoid the problems associated with producing large chips by combining a plurality of small-sized chips in a larger package. For example, U.S. Pat. No. 4,489,364, assigned to IBM, discloses a ceramic chip carrier for supporting an array of chips by means of solder balls. However, such MCMs tend to be extremely expensive because of their multilayered ceramic features and of their significantly more area requirement than the net overall area requirement of the combined set of chips.

Other similar approaches include a High Density Interconnect (HDI) structure proposed by the General Electric Company and generally described in IEEE magazine, 1991, "A 36Chip Multiprocessor Multichip Module made with the General Electric High Density Interconnect Technology". However, the HDI technology offers poor positional accuracy of chips, preventing the use of a fixed mask to make chip-to-chip connections, and thereby making the process of interconnecting individual chips extremely time consuming and expensive.

What is needed is a new integration scheme for combining, in close proximity, a plurality of semiconductor die units. Preferably, such new integration scheme also permits accommodating semiconductor chips having unequal thicknesses (e.g. heights)—resulting, for example, from fabricating the chips on different manufacturing lines and/or at different times.

SUMMARY OF THE INVENTION

It is an object of the present invention to provide a very dense integrated circuit package with circuit chips and a carrier assembled in a self-aligned manner.

It is another object of the present invention to provide an integrated circuit package with a more precise chip positioning and a tighter chip-to-chip placement on a carrier.

It is another object of the present invention to provide a very dense chip arrangement which accommodates chips having various heights (thicknesses), while effectively mechanically and electrically interconnecting immediately adjacent (neighboring) chips.

It is another object of the present invention to provide method(s) for fabricating such a very dense chip arrangement.

These and other objects of the invention are achieved, in one embodiment, by an integrated circuit package provided as an assembly of at least one integrated circuit chip and a carrier substrate, in which the substrate and circuit chip have surface topographies which interfit in a self-aligned manner. This self-alignment is accomplished by providing a surface projection on the carrier substrate which has a sloping sidewall that matches a beveled side edge of a surface depression provided in the bottom surface of the circuit chip, whereby the chip is positioned and immobilized on the carrier substrate projection.

To enhance the mechanical interlock provided between the carrier substrate and the circuit chip, angles of the juxtaposed sloping faces preferably are made at a same angle of inclination. This enhancement preferably is accomplished by crystallographically anisotropic orientational etching of the desired projection and recess surface profiles in similar semiconductor bulk materials used in the carrier substrate and chip integrated circuit materials. Further, the depth of the surface depression made in the chip and the height of the projection made on the carrier substrate preferably are made the same value to permit conformal juxta-positioning of not only the juxtaposed sloping faces but also to make the flats of the surface depression and substrate projection flush with each other.

Alignment of each chip on the carrier substrate preferably involves a match-up between two or four pairs of juxtaposed sloping faces, i.e., when the substrate projection is inserted within a trench or a four-sided well, respectively, provided in the bottom face of the circuit chip. Where more than one circuit chip is positioned on the carrier substrate by use of multiple separate projections on the substrate, it is preferable to provide a spacing gap between edges of adjoining (neighboring) chips to physically isolate the chips from each other, and these gaps are filled by a material having a flowable state to facilitate complete filling of the gap, and, after filling the gap, the material can tolerate the heat associated with various metallization operations.

This embodiment of the invention permits very dense packing of a plurality of circuit chips on a common carrier substrate without the need to leave thin walls or ridges of substrate material in-between chips. The thin ridges of substrate material can be relatively fragile in the case of semiconductor materials, so this embodiment of the present invention provides a more robust and durable assembly of the chip with the substrate.

In another embodiment of this invention, a self-aligned assembly of at least one integrated circuit chip and a carrier substrate is accomplished by instead providing a surface projection on the circuit chip which has a beveled side edge and a flat outer surface that matches and is flush with a sloping sidewall and a flat bottom surface, respectively, of a surface recess provided in the opposing face of the substrate carrier, whereby the chip is positioned in the substrate recess.

The above mentioned embodiments of this present invention enable precise placements of circuit chips on a chip carrier substrate with accuracies in a range of 0.1 $\mu$m to 0.3 $\mu$m. Marginal chip-to-chip spacing can be well-controlled by the present invention to provide appropriate spacing between the chips. For example, for chips that are intended to remain side-by-side in a close proximity to each other in the finished electronic package or arrangement, the spacing of a gap G between two chips can be reduced to approximately 1 $\mu$m or, according to additional inventive features of the present invention (discussed below), be controlled to a substantially constant spacing in a range of approximately 1 $\mu$m<G$\leq$approximately 100 $\mu$m; while on the other hand, gaps between chips that will be used as dicing streets, for instance, can be made to have an even larger spacings, e.g., up to approximately 100 $\mu$m or larger, if desired.

As mentioned above, an additional embodiment of the invention includes controlling the spacing to be greater than about 1 $\mu$m. According to the present invention, this spacing is useful when selected portions (eg, end portions) of two top faces of two immediately adjacent (neighboring) chips disposed on the carrier substrate lie substantially in respective parallel planes separated by a perpendicular distance (interchip surface planarity separation distance D) of greater than 0.0 $\mu$m. Thus, the selected portions of the two top faces are not co-planar for chips intended to be neighboring chips in the finished electronic arrangement. In this embodiment, the carrier substrate is shaped and dimensioned such that the gap G between neighboring chips has a marginal (minimum) spacing of greater than about 1 $\mu$m. For example, when the distance D is about 1 $\mu$m, the spacing of the gap G is about approximately 50 $\mu$m.

Further, at least one metallic interconnect (eg, metalization layer) is disposed at or over the two top faces, so as to mechanically and electrically to provide an interconnect between circuit devices residing on the neighboring chips. Parts of the metallic interconnect, at least at or over the selected portions of the top faces, have a substantially constant width—e.g., without limitation, approximately 5 $\mu$m. Preferably, the interconnect at a location over the gap has a greater width (e.g., +20% to +100%), to compensate for any thinning (reduced height) of the interconnect that may have occurred during a metallization process to provide the interconnect. For example, over the gap, the interconnect preferably has a rounded or a button-like shape having a maximum diameter of approximately 6 $\mu$m when the other parts of the interconnect have a maximum width of approximately 5 $\mu$m.

The present inventors believe that, for neighboring chips having top surfaces which are not co-planar, the metallic interconnect provided over a gap of greater than about one $\mu$m is less likely to break, and is more likely to possess a greater bandwidth (eg, higher data rates), than when the features of this additional embodiment are not present in the chip arrangement.

As endowed with the very dense chip-to-chip placement that can be provided by the present invention, a reduction in signal delays between chips is achieved. Also, the subsequent metallization interconnect can be done with standard hard mask back-end-of-line (BEOL) technology in standard process lines, thereby at least reducing the number of C4's needed as interconnect means through supporting package substrates.

The inventive packaging scheme also reduces the number of I/O's, reconstitutes chip yields, reduces chip power requirements, allows chip mixing, allows erector-set type chip building opportunities and can effectively accommodate chips having different heights (thicknesses).

For instance, the invention provides for smaller chips to be placed on a carrier substrate to permit higher yields. Also, different chips can be optimized in standard (e.g., DRAM, SRAM, Logic, and so forth) process lines before their marriage with other chips from other process lines, on a common carrier substrate, as opposed to attempting to use one large chip containing all elements of the final chip. Using such smaller chips as "chip sectors" in this way, the chip sectors can be separately pre-tested for quality and functionality before final placement on a common substrate, thereby optimizing final chip yields. The present invention also allows for a mix and match approach to chip placement with each other on a carrier substrate to realize large chip hybrids (e.g., GaAs with SOI, DRAM with Logic, and so forth). Thus, for example, chips having different primary electronic functions (e.g., microprocessors, main memories, non-volatile memories etc.) can be located on a common carrier substrate to realize various chip hybrid arrangements.

Also, the present invention allows elimination of electrostatic disharge system (EDS) circuits, thereby reducing power requirements. The inventive chip-and-substrate package is considered especially well-suited, e.g., for use in mobile communication and large area microprocessor chips.

BRIEF DESCRIPTION OF THE DRAWING

The foregoing and other objects, aspects and advantages will be better understood from the following detailed description with references to the drawing, in which.

Figure 1:
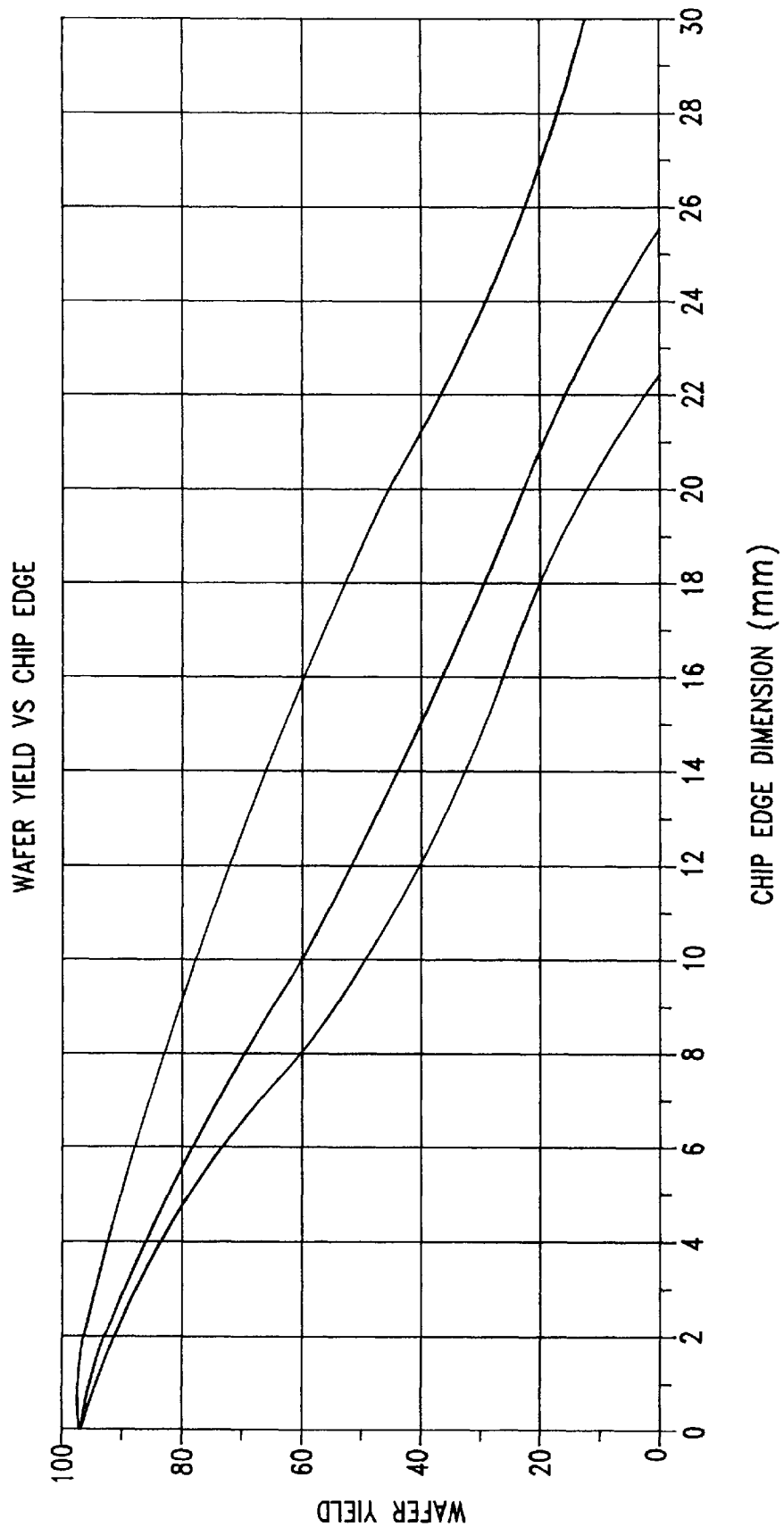
FIG. 1 is a graph depicting wafer yield as a function of chip edge dimension for square chips formed from a wafer 125 mm in diameter.
Figure 2A:
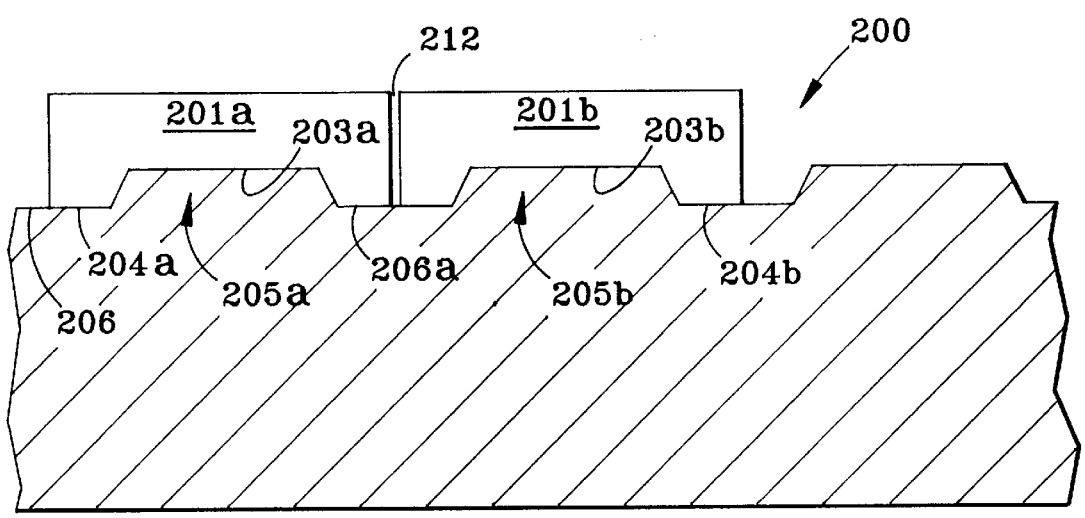
FIG. 2A depicts a chip and supporting substrate marriage according to a first embodiment of the invention, and FIG.

2B is a fractured representation of the chip-on-substrate assembly shown in FIG. 2A to clarify the dimensions.

Figure 3A:
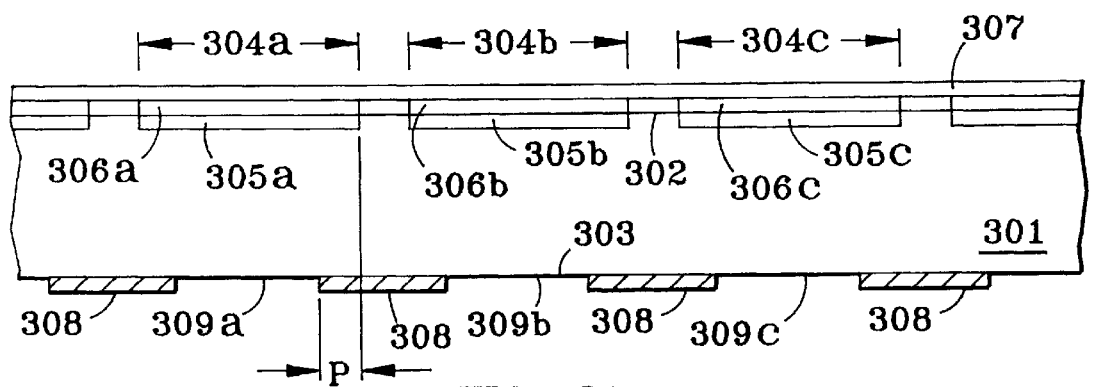
Figure 3B:
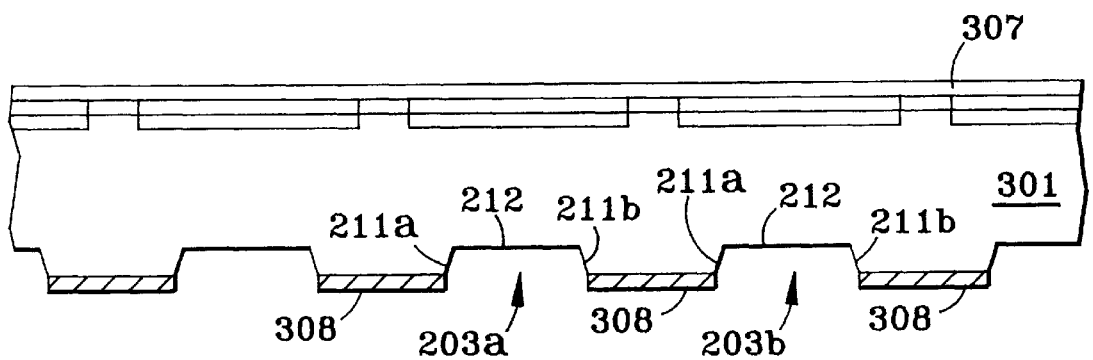
Figure 3C:
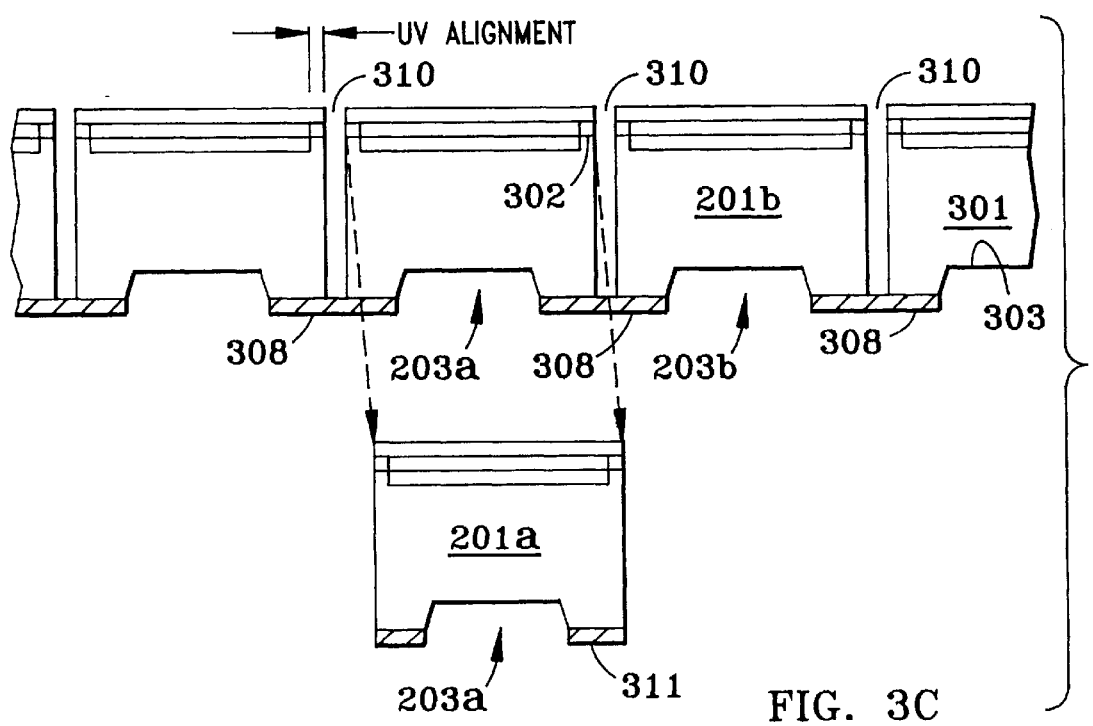

FIGS. 3A to 3C depict a method for forming a lithographically defined integrated circuit chip having a surface depression formed in the bottom face.

Figure 4A:
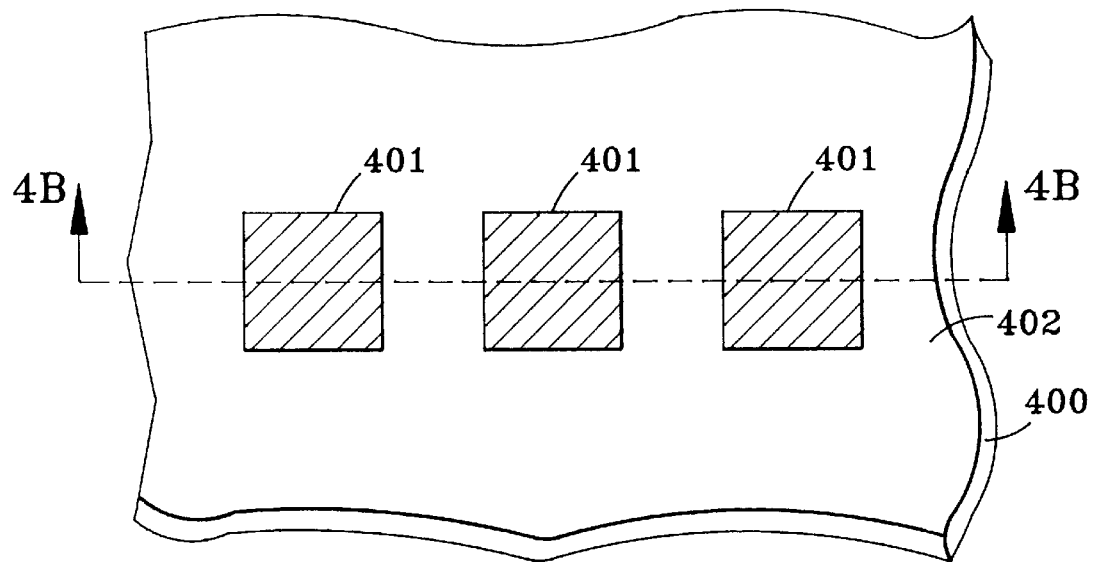
Figure 4B:
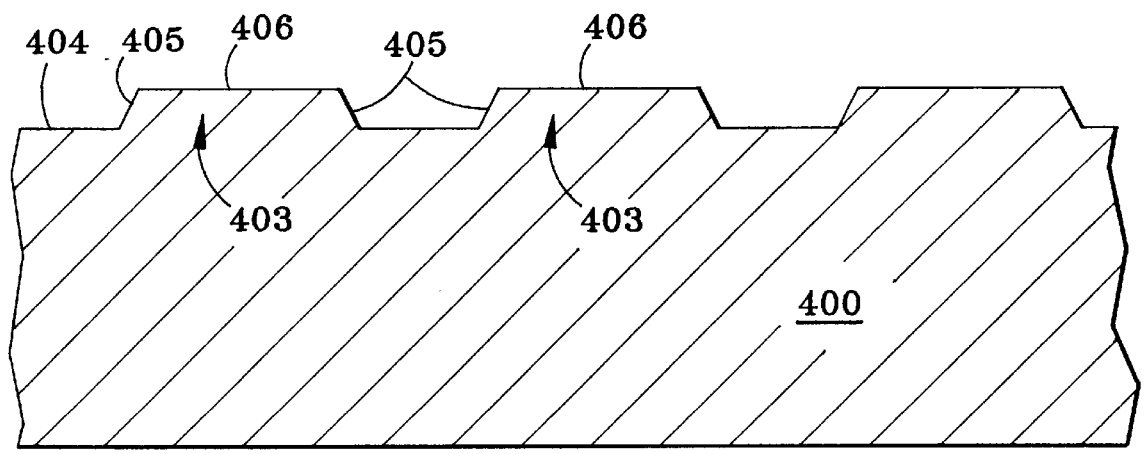

FIGS. 4A to 4B depict a method for forming lithographically defined projections on the upper surface of a carrier substrate for holding integrated circuit chips, where FIG. 4A is a top view of a partial section of the carrier substrate surface and FIG. 4B is a cross-sectional view taken from the perspective indicated in FIG. 4A.

Figure 5:
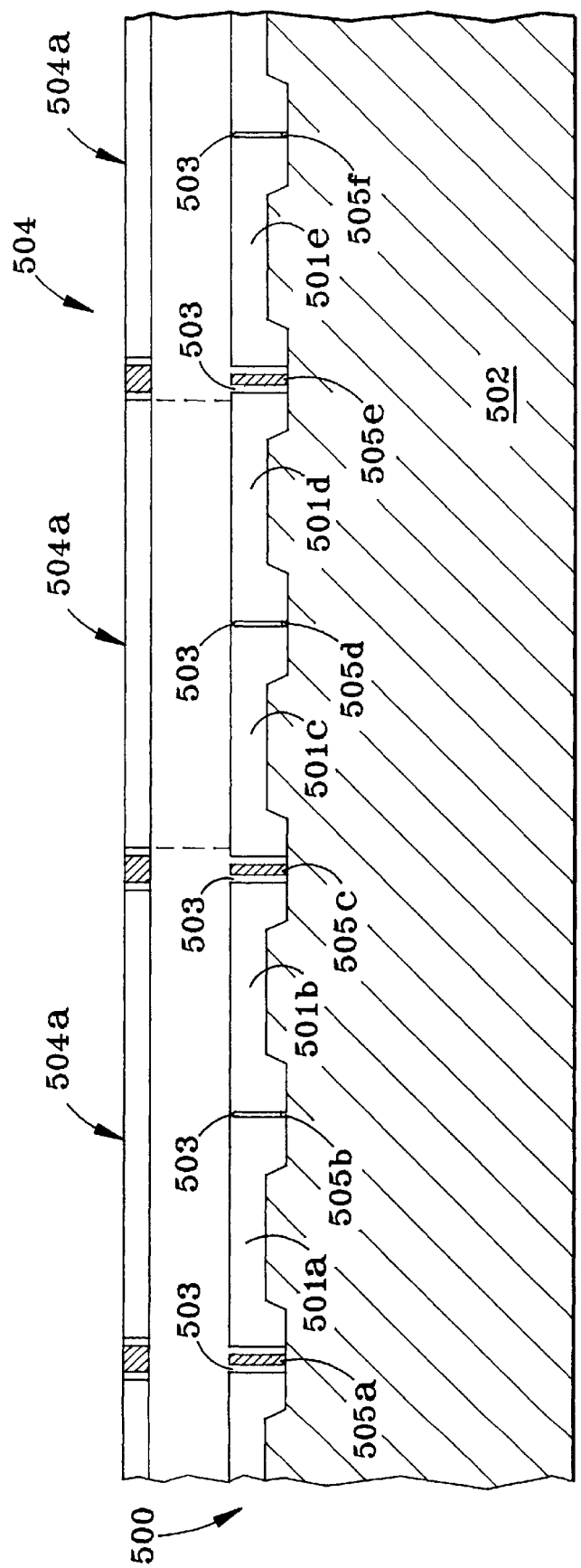

FIG. 5 shows a population of chips positioned on a common substrate carrier for a follow-on metallization process step.

Figure 6:
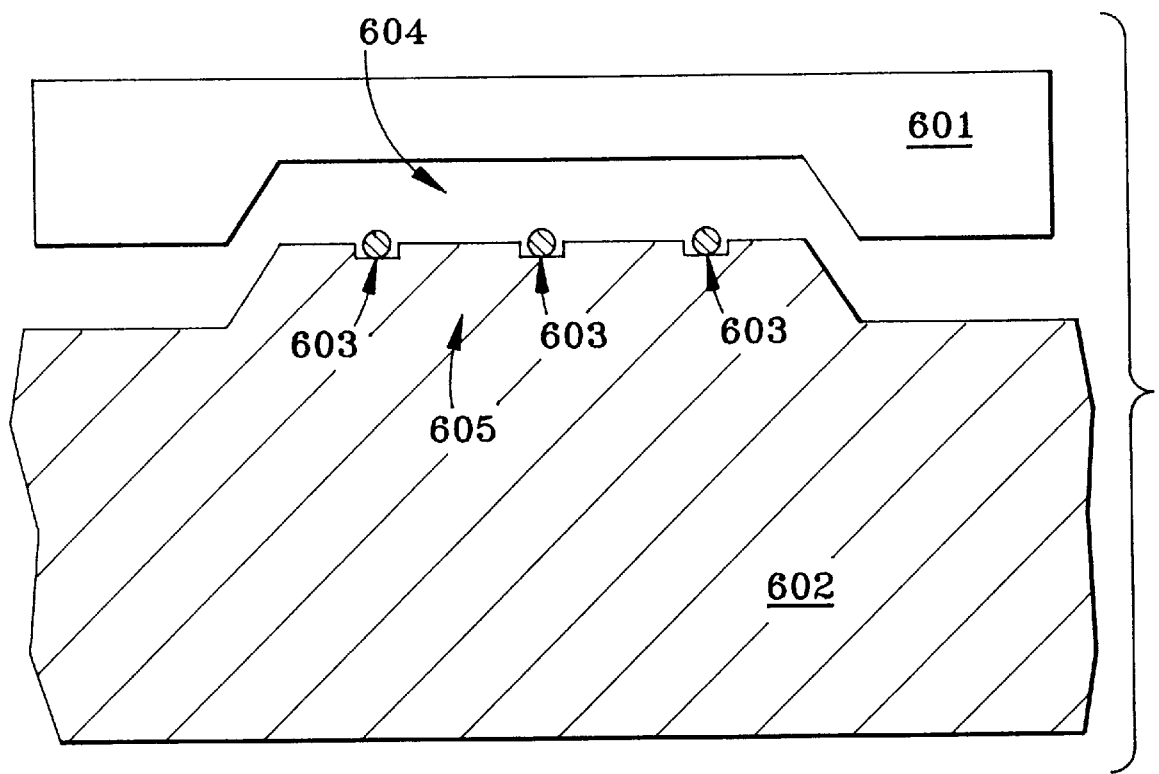

FIG. 6 shows an embodiment of the invention using C4s to allow possible chip removal at a later phase.

Figure 7:
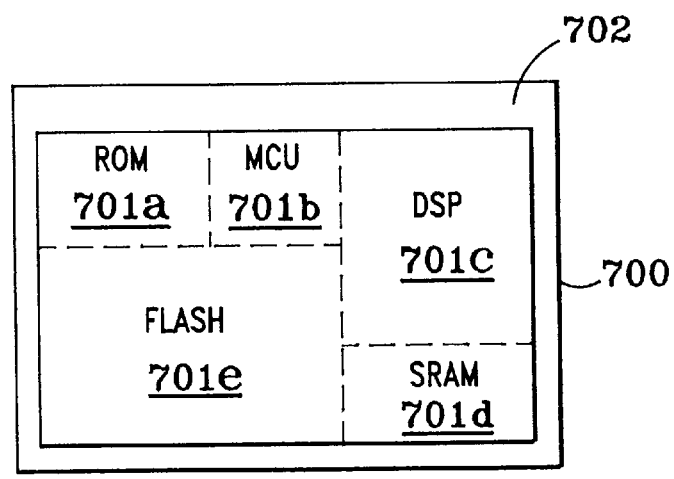

FIG. 7 depicts a top view of a hybrid chip package assembled according to the invention.

FIGS. 8A–8G depicts a scheme of process steps for making an assembly of circuit chips with a carrier according to a second embodiment of the invention.

Figure 8A:
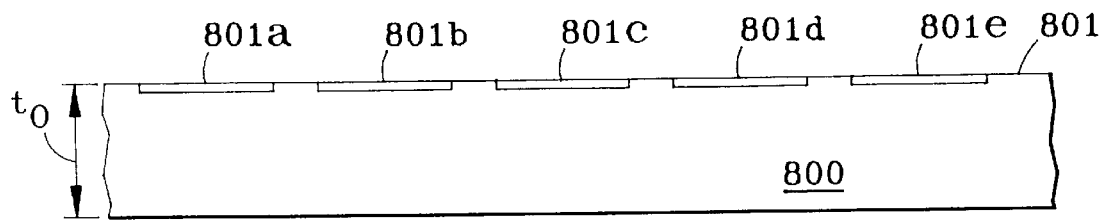
Figure 8B:
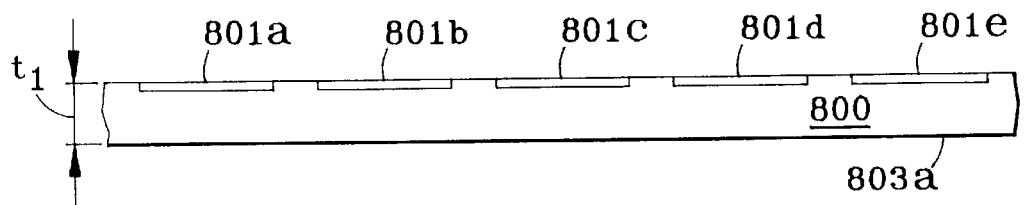
Figure 8C:
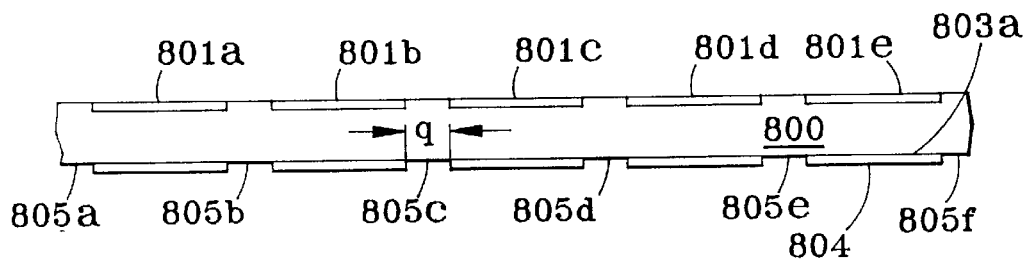
Figure 8D:
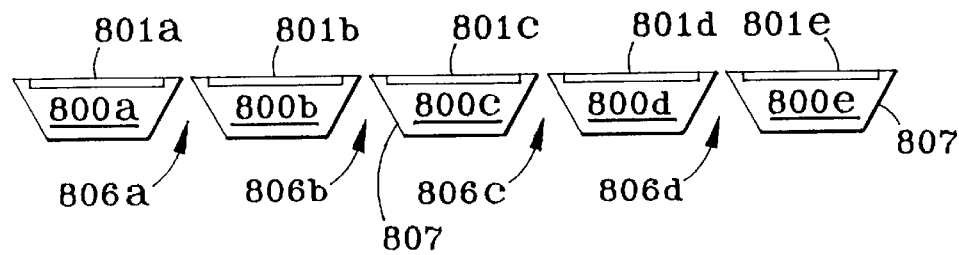
Figure 8E:
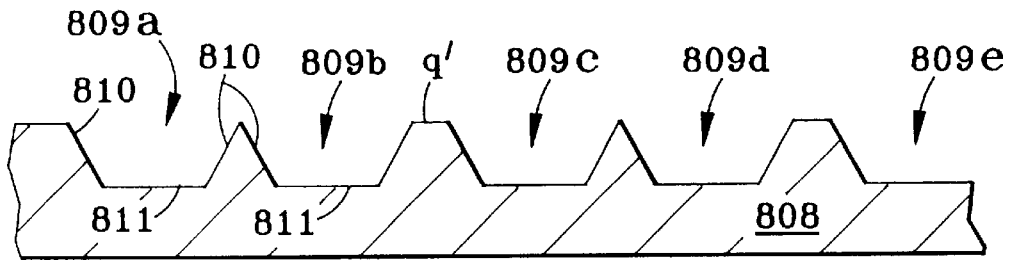
Figure 8F:
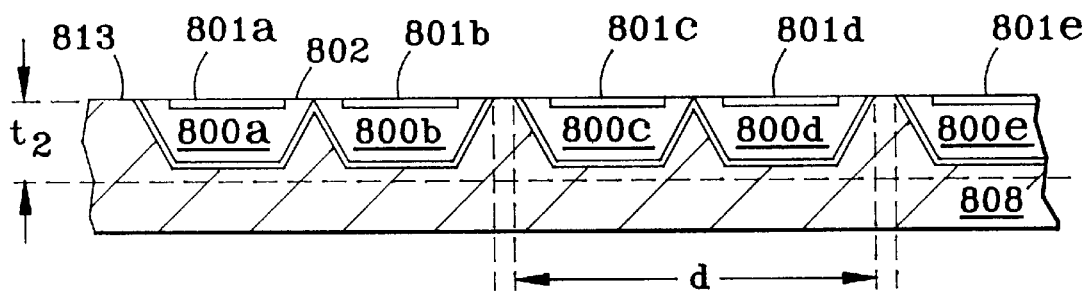
Figure 8G:
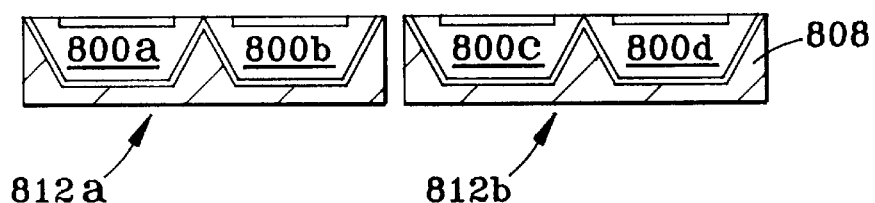
Figure 9:
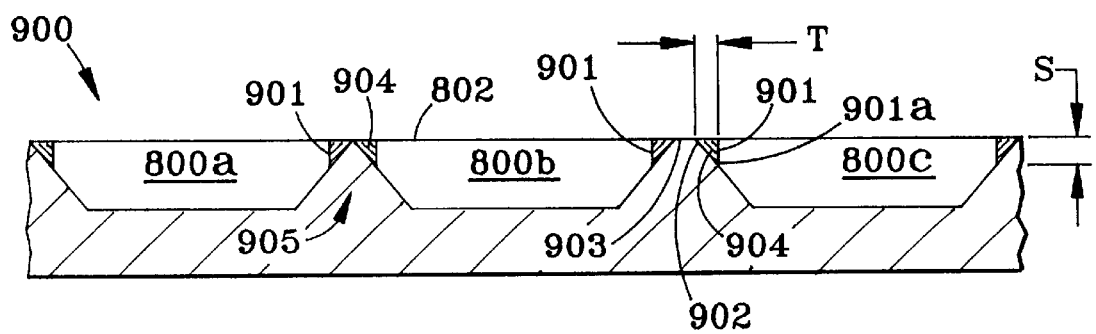

FIG. 9 shows a modification to the embodiment of FIGS. 8A–8G.

Figure 10A:
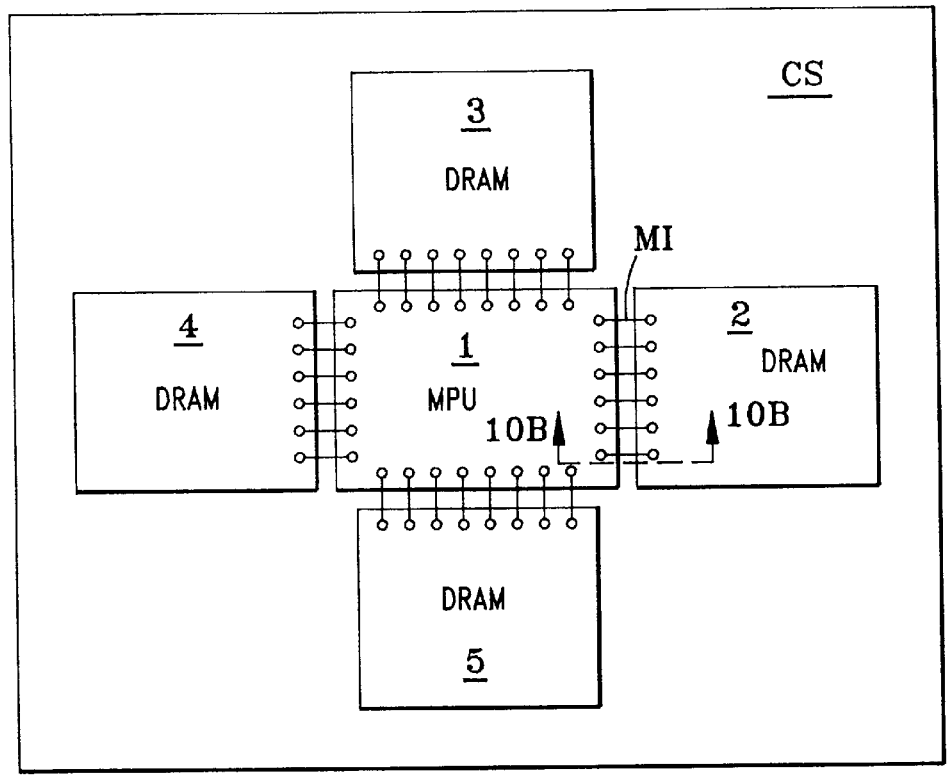

FIG. 10A is a top schematic view of an example partial hybrid chip arrangement according to the additional inventive embodiment useful particularly when the distance D (FIG. 10B) between top surfaces (TF1, TF2) of the chips 1,2 is greater than 0.0 μm.

Figure 10B:
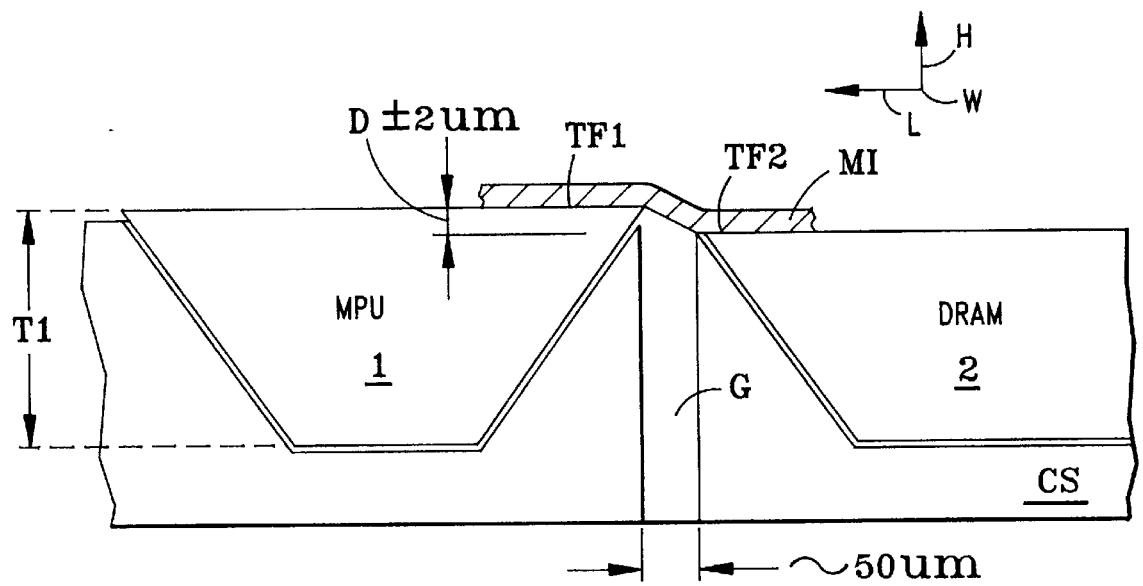

FIG. 10B is an enlarged partial side schematic view, partly in section, through the dashed line 10B shown in FIG. 10A, when the chips 1,2 have projections located within recesses of the common carrier substrate CS. FIG. 10B also shows directions for length (L), width (W) and height (H) of a metallic interconnect MI disposed at and over the top faces TF1,TF2 and the gap G.

Figure 10C:
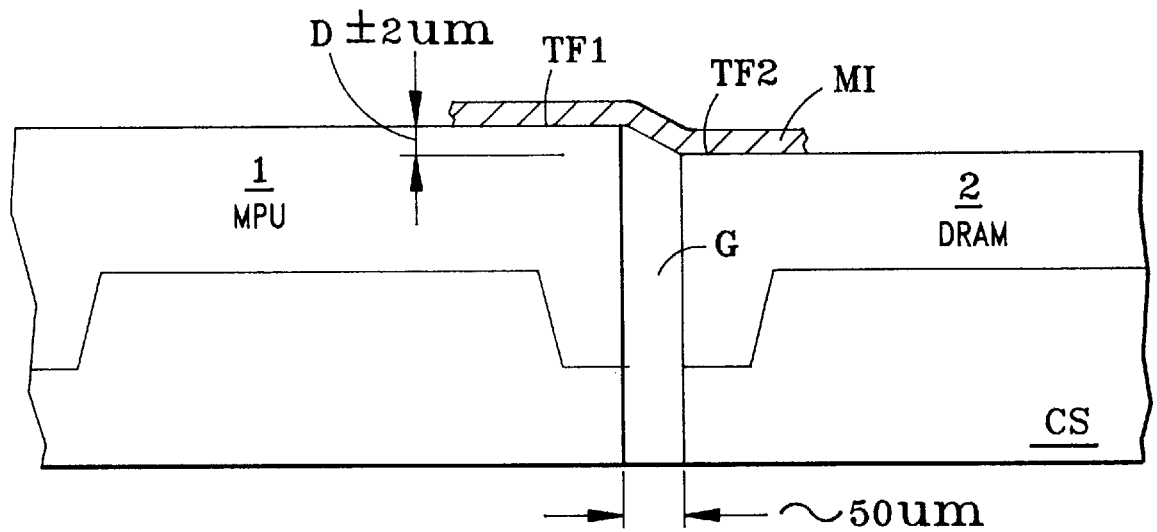

FIG. 10C is a view identical to that of FIG. 10B, when the chips 1,2 have recesses in which projections of the substrate CS are located.

Figure 10D:
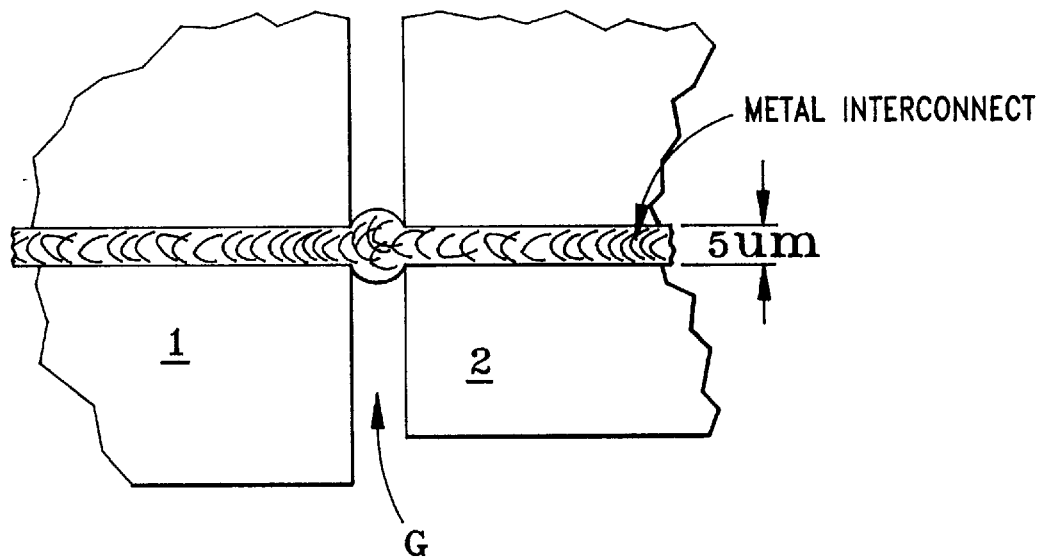

FIG. 10D is an enlarged partial top schematic view showing the metallic interconnect MI of FIG. 10B or FIG. 10C.

DETAILED DESCRIPTION OF THE PREFERRED EMBODIMENTS OF THE INVENTION

With reference to FIG. 2A, a chip-on-substrate assembly 200 of the invention is shown in which integrated circuit chips 201a,b are positioned on a carrier substrate 202 by interfitting surface depressions 203a,b on bottom faces 204a,b of the chips 201a,b with corresponding projections 205a,b extending from an upper face 206 of the carrier substrate 202. Although two chips are shown as positioned on the substrate for illustrative purposes, it will be understood that the present invention encompasses positioning a single chip or a plurality of chips on a substrate. Each of the chip depressions 203a,b can be a two-walled trench or a four-sided well configuration, where the carrier substrate projections 205a,b will have a corresponding configuration of either an upraised ridge or a mesa-like structure, respectively.

Figure 2B:
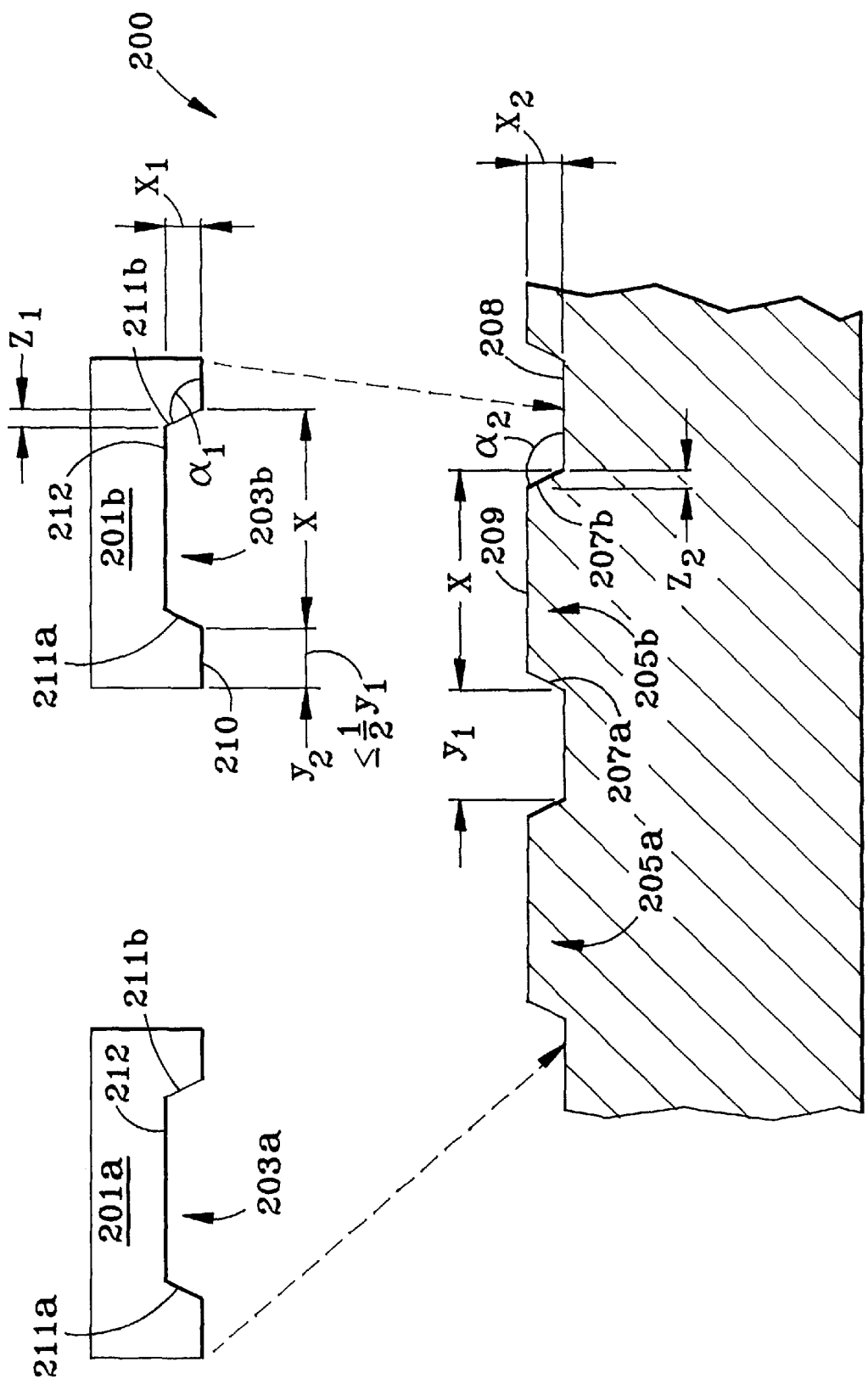

As shown in FIG. 2B, and by reference to chip 201b and projection 205b for sake of simplicity, the projection 205b has a lateral dimension "x" extending from where a first sloping sidewall 207a borders a planar substrate base 208 across a projection flat 209 to where a second sloping sidewall 207b borders the planar substrate base 208 again. In order to be able to insert and conformally match the contour of the surface depression 203b with the contour of the projection 205b, the surface depression 203b also has a lateral extent "x" extending from where an outer planar chip portion 210 borders a beveled edge 211a of the depression 201b across a recess flat bottom 212 to where a second beveled edge 211b borders the outer planar chip face 210 again. In order to ensure a conformal flush contact between the chip depression 203b and the substrate projection 205b, the depth $\lambda_1$ of the chip depression 203b will be essentially the same as the height $\lambda_2$ of substrate projection 205b; the lateral extent "$z_1$" of the beveled depression edges 211a,b will be essentially the same value as the lateral dimension "$z_2$" of the sloping sidewalls 207a,b; and, additionally, the angle of inclination $\gamma_1$ of the beveled edges 211a,b of the chip depression 203b is essentially the same as the angle of inclination $\gamma_2$ of the sloping sidewalls 207a,b of the projection 205b. For purposes of this illustration, chips 201a and 201b have identically dimensioned surface depressions 203a, 203b formed therein, which means that the carrier substrate projections 205a, 205b also have identical dimensions. A combination of different sized chips and/or chips having different shapes defined by their peripheral edges (e.g., mixtures of squares and rectangles, and so forth) can be positioned on a common carrier substrate, although the chip depressions and carrier substrate projections should have the same vertical dimensions from chip-to-chip.

Also, where more than one circuit chip 201a,b is positioned side-by-side on the projections 205a,b on the carrier substrate 202, as illustrated in FIG. 2A with the related dimensions indicated in the fragmented view of FIG. 2B, a lateral dimension "$y_1$" must be maintained between the projections 205a,b which is greater than or equal to the dimension "$y_2$" of chip outer face portions 210 so that there is room for both chip outer face portions 210 of adjoining chips 210a,b to fit on the planar substrate base portion 206a between projections 205a,b. In a preferred embodiment, it is desirable to size $y_2$ of adjacent chips 201a,b to leave a lateral gap 212 (see FIG. 2A) between the chips 201a,b as positioned on projections 205a,b. The lateral dimension of the space between the chips, i.e., the marginal chip-to-chip spacing defined by gap 212, can be well-controlled by the present invention to provide appropriate spacing between the chips 201a and 201 b.

For example, where chips 201a and 201b are intended to remain side-by-side in close proximity to each other in the finished electronic package, the spacing of gap 212 can be reduced to approximately 1 μm, or according to additional features of the present invention discussed in connection with FIGS. 10A–10D, the spacing of the gap 212 can be controlled to a substantially constant spacing in a range of approximately 1 μm<G≦approximately 100 μm; while, on the other hand, gaps between chips 201a, 201b that will be used as dicing streets, for instance, can be made to have a larger spacing, e.g., up to about 100 μm or larger, if desired. This gap 212 can be filled by a material (not shown) having a flowable state to facilitate complete filling of the gap 212 to provide a planar wafer surface available for further processing steps such as metallization procedures, and the gap filling material should be selected as a material able to tolerate the heat associated with the metallization operations, e.g., epoxy, polyimide or SOG.

When the depressions 203a,b on the bottom faces of the integrated circuit chips 201a,b and the carrier projections 304 on the upper face of the carrier substrate 202 are formed by crystallographic orientational etching, as described in more detail elsewhere herein, the integrated circuit chips 201a,b and carrier 202 are substantially self-aligning to each other, thereby easing insertion and some dimensional tolerances while still producing a precise result. Precise placements of the circuit chips on the chip carrier substrate can be achieved with accuracies in the range of 0.1 μm to 0.3 μm, although as discussed elsewhere herein certain embodiments of the invention can accommodate an constant interchip surface planarity separation distance D in a range of 0.0 μm<D≦about 2 μm; and chip-to-chip spacing can be reduced to approximately 1 μm, or for the certain embodiments be controlled to a substantially constant spacing of greater than approximately 1 μm, in the present invention.

Additionally, the carrier substrate 202 and integrated circuit chips 201a,b can optionally be provided with juxtaposed thermally conductive contacts or regions at the chip-to-carrier interface to facilitate heat dissipation during processing.

With reference to FIGS. 3A–3C, an exemplary method for forming the discrete integrated circuit chips 201a,b having the depressions 203a,b used for positioning the chips 201a,b on substrate projections 205a,b is described. As shown in FIG. 3A, a semiconductor chip substrate material 301 (e.g. a single crystal wafer) has an active surface 302, which represents the top surface of chips, and a passive surface 303, which represents the bottom surface of the chips. The active surface 302 is generally the side of the substrate on which the electronic devices are formed, and chip substrate 301 has several active areas 304a,b,c shown as already formed in active surface 302. The semiconductor substrate 301 may be silicon, germanium, gallium arsenide, CdSe, a compound of a Group II element and a Group VI element, a compound of a Group III element and a Group V element. The thickness of the wafer is relatively thin relative to the surface area presented. For this embodiment, the wafer thickness must be thick enough to allow the surface depressions 203a,b, etc. to be formed in the bottom face of the chip wafer without disturbing or otherwise affecting the opposite active side of the wafer. The wafer thickness can be a standard wafer thickness in the industry, such as about 700 to 800 μm for a 200 mm diameter wafer, for this embodiment, although it is not limited thereto.

The semiconductor chip substrate 301 has been previously processed by conventional techniques so as to fabricate integrated circuit devices generally indicated at 305a,b,c within the active areas 304a,b,c. The fabrication methods may vary with the type of integrated circuit devices desired, for example, bipolar, CMOS, biCMOS etc. After devices 305a,b,c have been formed in the active areas 304a,b,c, local metallization is provided. Conventional metallization techniques may be used. A first metallization layer 306a,b,c is deposited over the active areas 304a,b,c to selectively form connections between devices 305a,b,c within the same active area 304a,b,c. Preferably, additional metal layers (not shown), sufficient for enabling the testing of the finished integrated circuit chip, are also deposited at this step. Such testing preferably provides the ability to screen out defective integrated circuit chips after testing and prior to incorporating them into a larger package, thereby enhancing overall yield of the ultimate assembly.

After local metallization and testing, the active surface 302 of the semiconductor substrate 301 is coated with a protective layer 307 to shield the active areas 304a,b,c during further processing. The protective layer 307 preferably comprises one of many polymers (for example, polyimide), which are readily applied, are surface conformal, have adequate thickness (approximately 1–5 μm), and can withstand subsequent processes. After the protective layer 307 is placed on the active surface 302, the passive surface 303 of the chip substrate material 301 is covered with a silicon dioxide etch mask 308 formed thereon by growing or depositing a silicon oxide layer on wafer surface 303 by conventional techniques, and mask layer 308 is photolithographically patterned by conventional techniques to define exposed surface regions 309 a,b,c of the passive surface 303. While silicon oxide is preferred for the mask layer 308, the present invention is not limited thereto, as other conventional mask materials used for anisotropic wet etching of silicon wafers also could be used. The mask layer 308 has an alignment "p" beneath and with respect to the active areas 304a,b,c as shown in FIG. 3A.

With reference to FIG. 3B now, crystallographically anisotropic etching is performed on the exposed passive surface regions 309a,b,c using masking layer 308 as a mask resulting in removal of surface matter from chip substrate 301 at rates which differ depending on crystallographic direction. The preferential etching is applied to the bulk portions of the chip substrate material 301. In order to employ crystallographic orientation selective etching, the substrate 301 is chosen to have a particular crystalline orientation. For example, in FIGS. 3A through 3C, the semiconductor chip substrate 301 can be a (100) semiconductor wafer; that is, a single crystal semiconductor wafer having patterns of active surface 302 and passive surface 303 each aligned with [110] directions. The following discussion describes the beveled side edges 211a,b formed for a (100) semiconductor wafer, but reference features of varying shapes can be formed when using wafers of other orientations, or other etching techniques. In any event, the anisotropic wet etch of the chip substrate 301 in the areas 309a,b,c forms recesses 203a,b, etc., in the bottom wafer surface 303 comprised of beveled side edges 211a, 211b terminating on a flat bottom 212. The wet anisotropic etchants that can be used, include, for example, potassium hydroxide (KOH), hydrazine, quaternary ammonium hydroxides, and ethylenediamine solutions, as disclosed in the Journal of the Electrochemical Society (JECS), Vol. 139, No. 4 April 1992, pages 1170–1174, which teachings are incorporated herein by reference. These etchants, because of their anisotropic nature, have differential etch rates for different crystallographic planes, thereby creating a tapered or beveled side edges in the recess created. For example, using KOH etchant on a (100) silicon wafer, the etch angle will be 54.7° relative to the (100) plane, which means that the supplementary angle formed between either of the beveled side edges 211a and 211b of recesses 203a,b and wafer surface 303 will be 125.3° (i.e., angle $\gamma_1$ shown in FIG. 2B).

The geometric dimensions of the exposed passive surface areas 309a,b,c have an important function of controlling the lateral dimensions of the beveled recess edges 211a,b. Because the silicon etch is anisotropic, once the full (111) crystal surface is exposed it will thereafter form the planar recess bottom 212.

With reference to FIG. 3C, deep trenches 310 are then formed by a standard dicing technique through the active surface 302 of the chip substrate 301 around designated active areas 304a,b,c, which extend from the active surface 302 into the body of the semiconductor substrate 301 stopping on (or alternatively extending through) silicon oxide mask 308 on the opposite passive surface 303 of the chip substrate 301. The deep trenches 310 define the perimeter area dimensions of the integrated circuit chips. In this invention, an individual chip or a group of chips suspended on a common die unit can be positioned on the carrier substrate using the "key" formations formed underneath the chips and on top of the chip carrier substrate.

As indicated in FIG. 3A, once the deep trenches are formed by dicing, the chips 201a, 201b, and so forth, can be separated from each other by rupturing or otherwise separating the silicon oxide mask 308 at locations beneath trenches 310, to provide individual discrete integrated circuit chips available for later positioning on a carrier substrate projection described herein.

Before the depression 203a of circuit chip 201a is positioned upon a corresponding projection 205b of a carrier substrate 202, as shown in FIG. 2A, the remaining silicon oxide mask portions 308a shown in FIG. 3C can be removed and an appropriate surface binder (not shown) can be applied to the then exposed planar outer chip surfaces 311 on the bottom face of the chip. For example, polyimide may be applied at a temperature of 100° C. by standard application methods. The binder material may also have thermally or electrically conductive properties to allow heat transmission. The integrated circuit chips 201a,b, etc. are then placed on the carrier substrate projections such that the metallization layers 306a,b, etc., are facing up—i.e., in a direction facing away from the carrier substrate (e.g., 202).

With reference to FIGS. 4A and 4B, a method for forming a carrier substrate, such as the type exemplified as carrier substrate 202 shown in FIG. 2A, for positioning a plurality of integrated circuit chips will now be described. First a carrier substrate 400 is provided. Typically, the carrier substrate will have a larger surface area than a circuit chip to be supported thereby, so that a plurality of circuit chips can be attached to a common carrier substrate.

The carrier substrate 400 is preferably crystallographic and more preferably a semiconductor, such as single crystal silicon, germanium, gallium arsenide, CdSe, a compound of a Group II element and a Group VI element, or a compound of a Group III element and a Group V element. The carrier substrate 400 preferably has a crystallographic orientation and a thermal coefficient of expansion similar to those of the circuit chips to be held. More preferably, the carrier substrate 400 is the same material as the semiconductor chip substrate 301 used in the fabrication of the circuit chips, such as chips 201a,b described supra.

With reference to FIG. 4A, a silicon dioxide masking layer 401 is formed on an upper face 402 of carrier substrate 400 and patterned by conventional photolithographic techniques to expose the upper face 402 at locations surrounding the remaining islands of the mask 401. As discussed above, silicon oxide is merely a preferred mask layer material, and masking layer 401 is not limited thereto, as other conventional mask materials used for anisotropic wet etching of silicon wafers also could be used. After such patterning, the semiconductor substrate 400 is crystallographically anisotropic etched using similar techniques as described above in connection with the formation of the surface depressions in the circuit chips per the discussion of FIG. 3B. That is, carrier substrate 400 can be selected to be a (100) semiconductor wafer and the wet anisotropic etchants described above for forming the depressions, viz. four-sided trenches, in the bottom surface of the chips, are equally useful to form the corresponding projections on the surface of the carrier substrate.

However, an important difference is that the mask pattern 401 used in the crystallographic anisotropic etching of the carrier substrate 400 is the opposite, i.e., a "negative" in a photographic sense, of the mask pattern 308 used for etching the depressions 203a,b in the chip substrate 301. As a consequence, and as shown in FIG. 4B, projections 403 are formed having sloping sidewalls 405 rising from a planar base portion 404, which is a new upper surface portion revealed by the etching, to a planar projection top surface 406, where the projection top surface 406 is comprised of the original upper face 402 of the carrier substrate 400. By using crystallographic anisotropic etching in this manner on similar materials for both the chip substrate and the carrier substrate, it is possible to form surface depressions in the chip bottoms which counter-correspond to the profiles of the projections formed in the surface of the carrier substrate. Therefore, when the depressions (recesses) in the chip bottoms are positioned on their corresponding carrier substrate projections, a conformal interfit is achieved to provide a robust mechanical interlock of the components.

The projections 403 formed from the photolithographic pattern shown in FIG. 4A are illustrated as four-sided mesa-like structures having four sloping sidewalls. It can be understood that if an etch mask stripe is provided to extend from one edge of the carrier substrate to an opposite edge thereof, a ridge-like projection would be created by the etching procedure. Such a ridge-like projection on the carrier substrate would be needed where a trench-like depression (i.e., two spaced beveled edges extending along a common flat trench bottom) is formed on the bottom surface of a chip from one edge thereof to the other for chip positioning purposes.

In the implementations of this invention, conventional chip handling and placement tools, such as robotic placement chucks and vacuum probes (or arms) capable of controlled x-y or x-y-z movement, may be used to position an integrated circuit chip fabricated according to this invention, such that its surface depression is interfitted with a corresponding surface projection provided on the carrier substrate surface. The circuit chips to be placed onto the carrier substrate projections will be given the appropriate orientation by having them aligned with the help of an orientator. Further, the integrated circuit chips can be placed into an inclined hopper and can slide into a corner serving as an orientation reference point. Once the circuit chip is properly oriented, a robotically controlled vacuum probe will place the chip onto carrier substrate projections, the orientation of which has been similarly aligned. Once in place, the chips are mechanically agitated to insert fully onto the carrier substrate projections. If required, assistance of an optical flat platen can be used to assure complete insertion.

Optionally, one or more pressure relief holes (not shown) can be drilled through the carrier substrate, preferably prior to assembly, in order to relieve pressure created by trapped gases. Suitable drilling techniques include laser ablation, ion beam milling or cryogenic plasma etching.

With reference to FIG. 5, there is shown a population of IC chips 501a–e positioned on a common substrate carrier 502. At least one metallization layer (not shown) can be applied to the finished chip-on-substrate assembly 500 in a follow-on metallization process step using a fixed mask 504 having apertures 504A. Because of the tight alignment tolerances, a metallization layer can be patterned through the fixed mask 504 to provide connections between a desired set(s) of the integrated circuit chips 501a–e. Also, a gap filler 503, discussed earlier herein, fills gaps 505a–f between the various chips. The resulting assembly can be protected by a chip carrier protection layer (not shown), such as polyimide or SOG layer, and applied by standard techniques.

FIG. 6 shows an embodiment of the invention in which the integrated circuit chip 601 having a surface depression 604 of the type previously described herein is mated with a projection 605 of the carrier substrate including C4 metal interconnects 603 provided at the interface of the chip 601 and carrier substrate 602. The C4 solder balls are shown as situated on the projection 605 and they will collapse and form the interconnects when the chip depression 604 is positioned flush with the projection 602. This chip-on-substrate configuration can be useful to allow possible chip removal at a later time.

FIG. 7 depicts a top view of an example of a hybrid chip package that can be assembled according to the invention. Using the chip depression/carrier substrate projection system of this invention, a variety of different types of integrated circuit chips and sizes can be assembled together on a common substrate. As illustrated in FIG. 7, the final integrated package 700 has variegated chips 701a–e comprised of ROM, MCU, DSP, SRAM and FLASH chips positioned on a common carrier substrate 702. It should be noted that the integrated circuit chips 701a–e which are assembled onto the carrier 700 are not limited to the examples provided here, and they may be formed from substrates of similar or dissimilar materials, and the processing methods to form the active devices in the integrated circuit chips may have been radically different from each other provided that the chip positioning means of the present invention is employed.

FIGS. 8A–8G depict a scheme of process steps for making an assembly of circuit chips with a carrier according to a second embodiment of the invention. As shown on FIG. 8A, a testable chip wafer substrate 800 having active areas 801a–e formed on its top face 802 is provided. The wafer substrate 800 is a (100) semiconductor wafer, having a top face 802 with patterns aligned with the [110] direction and a bottom face 803. The wafer substrate 800 has a standard initial wafer thickness $t_0$ which typically is from about 700 to about 800 μm for a 200 mm diameter wafer.

Next, as shown in FIG. 8B, the backside 803 of the chip wafer is thinned by a wet anisotropic etching, e.g. using KOH, to provide a reduced wafer thickness $t_1$, and the thinning exposes a new backside surface 803a. It is desirable to thin the wafer substrate 800 as much as reasonably possible without making the wafer 800 too fragile such that it cannot tolerate further IC processing and package assembly conditions without structural failure. With these guidelines in mind, an optimal amount of wafer thinning can be determined empirically by one of ordinary skill in the art. For example, a useful thinned thickness $t_1$ for silicon wafers used as chip wafer substrate 800 is about 200 to about 300 μm.

Then, as shown in FIG. 8C, after thinning of the wafer substrate 800, a silicon dioxide masking layer 804, or other conventional mask material for anisotropic wet etching of silicon, is formed on the wafer backside 803a and photolithographically patterned to define exposed backside surface areas 805a–f.

As shown in FIG. 8D, crystallographic orientational etching is then employed on the backside 803a of the wafer 800 to form recesses 806a–d having beveled edges which define chips 800a–e. The mask 804 is appropriately patterned in the prior step shown in FIG. 8C to define openings having widths "q" which will enable the beveled edges 807 formed in the wafer by the crystallographic etching to breach the opposite face 802 of the wafer 800 before the full (111) crystal surface is exposed; causing a wedge-shaped bottom to be formed in the wafer.

The wet anisotropic etchants that can be used include those already described elsewhere herein, for example, potassium hydroxide (KOH), hydrazine, quaternary ammonium hydroxides, and ethylenediamine solutions, as disclosed in the Journal of the Electrochemical Society (JECS), Vol. 139, No. 4 April 1992, pages 1170–1174, which teachings are incorporated herein by reference. The etching procedure will separate the chips 800a–e from each other unless a removeable tape, or the like, is previously applied across top surfaces of the chips to prevent the chips from floating apart upon the completion of the wafer etching procedure. The patterned mask 804 is then removed from chips 800a–e.

Next, as shown in FIG. 8E, a carrier substrate 808 is subjected to crystallographically orientational etching using masking and etching techniques similar to those used to prepare the chip surface depressions in FIGS. 3A–3C described above. The recesses 809a–e thereby formed in the carrier substrate 808 each have sloping sidewalls 810 extending to a flat recess bottoms 811. The profile of the recesses 809a–e matches, in counter-correspondence, the profiles of the chips 800a–e comprised of beveled edges and flat outer face 803a. Also, spacings "r'" and "q'" are provided between the etched recesses 809a–e by appropriate patterning of the etch mask used on the carrier 808, such that the spacing "q'" will accommodate dicing and that the spacing "r'" will represent the chip-to-chip spacing desired between the chips 800a and 800b, and 800c and 800d.

As shown in FIG. 8F, the chips 800a–e are inserted into the recesses 809a–e in the carrier substrate 808 in a self-aligned manner. The beveled chip edges 807 facilitate insertion of the chips 800a–e into the recesses 809a–e until the flat outer face 803a of the chips 800a–e comes to rest on bottoms 811 of the recesses 809a–e in the carrier 808. The beveled chip edges 807 and bottom face 803a are flush with the juxtaposed sloping sidewalls 810 and depression bottoms 811 in the carrier substrate. Thus, the angles of inclination of the beveled edges 807 at least substantially correspond to those of sloping sidewalls 810; the lateral widths of the flat chip bottoms 803a at least substantially correspond to those of the depression bottoms 811; and the depths of the recesses 809a–e in the carrier 808 at least substantially correspond to the thicknesses of the chips 800a–e.

With reference to FIG. 8F, the outer planar surface 813 of the carrier is preferably parallel, or more preferably co-planar, with the top face 802 of the chips. To the extent the upper metallization layer 801a–e of the integrated circuit chips 800a–e is not substantially flush with the top surface 813 of the carrier 808, it is desirable to fill-in any low-lying areas with an additional binder material, for example, spin-on glass (SOG) or polyimide (PI), utilizing standard spin-on and bake techniques, while also filling in any gaps between chips 800a–e and carrier 808.

As an optional additional step, after marriage of the chips 800a–e with the carrier recesses 809a–e, the carrier 808 can be backside thinned by grinding to a thickness "$t_2$" and then diced at locations "d", as indicated in FIG. 8F. As shown in FIG. 8G, this results in the individual chip-on-substrate assemblies 812a and 812b.

FIG. 9 shows a modification to the embodiment illustrated in FIGS. 8A–8G. Numerals used in FIG. 9 in common with those discussed above with reference to FIGS. 8A–G have the same meaning. The protocol used to fabricate the chip-and-carrier assembly 900 depicted in FIG. 9 is generally the same as that described above in reference to FIGS. 8A–8F with the following differences. The crystallographic orientational etching, such as performed on the masked underside 804/803a of the wafer 800 as illustrated in FIGS. 8C and 8D, is changed in that the wet anisotropic etching is terminated before the top side 802 of the wafer 800 is breached. By stopping the wafer etch operation short and dicing the remainder of the unetched bulk of chips 800a–c, blunted chip edges 901 are created on the top surface 802 of chips 800a–c. For example, the wet etching of the wafer 800 can be terminated when approximately 65% to <100% of the thickness of the wafer 800 has been etched through. The blunted chip edges 901 are less fragile than sharp brittle corners. The unetched thickness "S" of the wafer 800 can be about 10 to about 20 µm for silicon wafers, although not necessarily limited thereto. A gap "T" provided between the chip side edge 901a and the closest edge 902 of the adjoining carrier flat 903 can be about 20 µm for silicon wafers, although not necessarily limited thereto. Since gaps 904 will form between the blunted chip edges 901 and lands 905 formed in the carrier 808 between carrier recesses 809a–e, a gap filler material, such as polyimide, is applied to fill gaps 904.

Thereafter, the chip-on-carrier assembly 900 can be diced and optionally thinned in the same manner as described above in connection with FIGS. 8F and 8G.

Referring now to FIGS. 10A–10D, there are shown aspects of an additional embodiment of the present invention useful particularly when the planarity separation distance D (FIGS. 10B, 10C) is greater than 0.0 µm.

FIG. 10A shows one example of a partial hybrid chip arrangement immediately after an interim step in a fabrication process according to the present invention—e.g., immediately after a metallization step suitably interconnecting each of four volatile memory chips (e.g., DRAM chips 2–5) and a microprocessor chip (e.g., MPU chip 1). The chips 1–5 are located on a common carrier substrate CS, e.g. of silicon according to the chip depression/carrier substrate projection system of the present invention (e.g., FIGS. 2A–2B, FIGS. 8A–8G, FIG. 9 and/or FIG. 7), but are sized such that the distance (D) between top face portions TF1, TF2 of, eg, the chips 1,2 is greater than 0.0 µm. Such distance is a result, for example, of manufacturing the chips 1,2 on different wafer process lines, so that a height (thickness T1) of chip 1 (eg, distance between top face 802 and bottom face 803a—see FIG. 8D) is up to approximately 2 µm greater (or less) than a height of the chip 2.

It will be understood by those skilled in the art that the gap G may be an actual void created with masking and etching techniques similar to those of FIGS. 3A–3C, or that alternatively the gap G may represent the spacing r' of a carrier substrate CS created according to all or part of FIGS. 8A–8G. The full thickness of the substrate CS is not shown in FIG. 10B, or FIG. 10C.

Thicknesses of the chips 1,2 are ascertained during, e.g., any conventional chip sort step or by other empirical or statistical measurement steps well known in the art which are performed before the spacing r' (FIG. 8 E) or the lateral gap 212 (FIG. 2A) or the gap G (FIG. 10B or FIG. 10C) is determined.

After such conventional step, the gap G is formed (e.g., by a suitable mask having a construction which would be well understood by those skilled in view of the present specification and figures) such that the spacing of the gap is suitably greater than 1 µm. For a 2 µm non-planarity distance D, a 50 µm spacing of the gap is particularly desirable. Preferably, the gap G is thereafter suitably filled with a filler material (not shown) prior to a metallization process in which a metallic interconnect MI is provided as shown in FIGS. 10B–10D (e.g., by a suitably configured hard mask having a construction which would be well understood by those skilled in view of the present specification and figures) between the chips 1,2. In FIG. 10B or FIG. 10C, the interconnect MI has a substantially uniform gradual slope $$\frac{D}{G} \cong \frac{2}{50}$$

over the gap G. Preferably, $$\frac{D}{G} \cong \frac{1}{10-100}.$$

Also preferably, to compensate for any thinning of MI occurring over the gap G, the interconnect is made wider (e.g.,±20%) at a location over the gap G. Thus, a more mechanically and electrically robust interconnect is achieved over that which would result if the gap G had a spacing of, eg, 1 µm when the distance D was greater than 0.0 µm.

The present invention enjoys various advantages over prior art schemes. Because the respective depressions and projections provided in both the integrated circuit chips and the carrier substrate are defined lithographically, and created with anisotropic etching methods, the respective dimensions are highly controllable.

The ability to control critical dimensions to extremely precise tolerances makes possible the use of a fixed mask for the final metallization steps rather than more expensive methods, thereby reducing over the prior art the cost of manufacturing the assemblies. The method also reduces the overall size of the assembly due to smaller space requirements.

Still another advantage is improved overall chip yields of such chip assemblies over single large area chips having similar functionality. The improved yield derives from the generally superior yields of smaller chips coupled with pretesting of such chips prior to final assembly.

Still another advantage is the ability to assemble dissimilar integrated circuit chips (e.g. silicon, gallium arsenide, etc.), requiring different processing conditions, into a final chip assembly.

Still another advantage is the ability to accommodate satisfactorily chips having different thicknesses.

While the invention has been described in terms of a few preferred embodiments, those skilled in the art will recognize that the invention can be practiced with modification within the spirit and scope of the appended claims. For example, by causing the circuit chip and carrier to take on other shapes, such as nonrectangular shapes, the alignment and orientation of the circuit chips to the carrier can benefit. Thus, geometric alignment keys of various designs can be included in this fabrication methodology.

What is claimed is:

1. A method, comprising:
providing a carrier substrate including a plurality of surface projections having sloping sidewalls;
providing a plurality of chips having bottom faces forming surface depressions with beveled edges matching and being in conformal juxtaposition with the sloping sidewalls, the plurality of chips also forming top faces at sides opposite the bottom faces, portions of at least two of the top faces lying substantially in at least two planes separated by a minimum distance (D) in a range of 0.0 µm<D≦2 µm, at least two of the chips being separated by a gap (G) having a minimum spacing in a range of 1 µm<G≦100 µm, and providing at least one metallic interconnect disposed over the portions and the gap.

2. The method as claimed in claim 1, wherein said step of providing at least one metallic interconnect includes providing a metallic interconnect having a width W over the top surfaces in a range only of 0.5 µm≦W≦5 µm.

3. The method as claimed in claim 1, wherein said step of providing at least one metallic interconnect includes providing a metallic interconnect having a width W in a range only of 1 µm≦W≦10 µm over the gap G.

4. The method as claimed in claim 1, wherein said distance D and said gap G are related according to the following relationship:

$$\frac{D}{G} \cong \frac{1}{10-100}.$$

5. The method as claimed in claim 1, wherein the metallic interconnect has a width over said gap greater than a width over at least one of said portions.

6. The method as claimed in claim 1, wherein the at least two chips have different primary electronic functions.

7. The method as claimed in claim 6, wherein the different primary functions are the functions of a microprocessor and a main memory.

8. The method as claimed in claim 1, wherein the at least two chips have identical primary electronic functions.

9. The method of claim 1, wherein said step of providing at least one metallic interconnect includes utilizing a hard mask arranged and dimensioned for the metallic interconnect.

10. The method of claim 1, wherein the carrier substrate includes an upper face comprised of a planar base surface portion bordering at least one of said projections, the projection has a flat top surface, the sloping sidewall of the projection extends from the planar base surface portion to the flat top surface of the projection, and one of the circuit chips includes a bottom face comprised of a planar outer chip surface portion bordering the surface depression and the surface depression has a planar recess bottom surface, and wherein the beveled edge of the surface depression extends from the bottom face to a planar recess bottom surface.

11. The method of claim 10, wherein the recess bottom surface rests on a flat top surface of the projection, and the bottom face rests on a planar base surface portion of the carrier substrate.

12. The method of claim 1, wherein the surface depression in at least one of the chips has at least two beveled edges and at least one of the carrier substrate projections has at least two sloping sidewalls, and wherein the at least two beveled edges of the surface depression in the at least one chip are in juxtaposition with the at least two sloping sidewalls of the at least one substrate projection.

13. The method of claim 1, wherein the surface depression in at least one of the chips has four beveled edges and at least one of the substrate projections has four sloping sidewalls, and wherein the four beveled edges of the surface depression in the at least one chip are in juxtaposition with the four sloping sidewalls of the at least one carrier substrate projection.

14. The method of claim 1, wherein said step of providing a carrier substrate includes selecting a material of at least a bulk portion of the carrier substrate to have a same crystallographic structure as a material of at least a bulk portion of at least one of the chips.

15. The method of claim 14, wherein the material of the bulk portion of the carrier substrate is essentially the same as the material of the bulk portion of the at least one chip.

16. The method of claim 15, wherein the material is a semiconductor material.

17. The method of claim 16, wherein the material is silicon.

18. The method of claim 17, wherein the silicon is a (100) wafer, the bottom face is aligned with a [110] direction and the beveled edge is a (111) oriented crystal face, and the flat top surface of the projection is aligned with the [110] direction and the sloping sidewall is a (111) oriented crystal face.

19. The method of claim 17, wherein the sloping sidewall of the projection forms an angle of approximately 125.3° with the flat top surface of the projection, and the beveled edge forms an angle of approximately 125.3° with the bottoms face.

20. A method, comprising:

providing a carrier substrate, the carrier substrate comprising an upper face including planar outer surface portions bordering at least two neighboring surface recesses having sloping sidewalls and flat recess bottom surfaces, the at least two neighboring surface recesses being separated by a minimum spacing of greater than 1 µm;

providing at least two integrated circuit chips having different thicknesses, the at least two integrated circuit chips comprising top faces and bottom faces, the bottom faces including projections, the projections having planar outer surfaces and beveled edges matching the sloping sidewalls;

positioning the beveled edges and the sloping sidewalls to be in conformal juxtapositions, so that the chip projections are conformally located in the surface recesses of the carrier substrate, and that the top faces of the at least two chips lie substantially in respective planes separated by a minimum distance corresponding substantially to the difference between the different thicknesses, and providing at least one metallic interconnect disposed over the top faces of the at least two chips.

21. The method as claimed in claim 20, wherein said step of providing at least one metallic interconnect includes utilizing a hard mask configured for the metallic interconnect.

22. The method as claimed in claim 20, wherein said step of providing the at least one metallic interconnect comprises providing the interconnect over the spacing between the at least two neighboring surface recesses.

23. The method as claimed in claim 22, wherein said step of providing the at least one metallic interconnect further comprises providing the interconnect such that the interconnect has a gradual slope over the spacing.

* * * * *